United States Patent [19]

Sakemi et al.

[11] Patent Number: 5,489,750
[45] Date of Patent: Feb. 6, 1996

[54] METHOD OF MOUNTING AN ELECTRONIC PART WITH BUMPS ON A CIRCUIT BOARD

[75] Inventors: Shoji Sakemi, Fukuoka; Yoshiyuki Wada, Onojo, both of Japan

[73] Assignee: Matsushita Electric Industrial Co., Ltd., Osaka, Japan

[21] Appl. No.: 457,805

[22] Filed: Jun. 1, 1995

Related U.S. Application Data

[63] Continuation of Ser. No. 205,630, Mar. 4, 1994, abandoned.

[30] Foreign Application Priority Data

Mar. 11, 1993 [JP] Japan ................................. 5-050464
Jan. 18, 1994 [JP] Japan ................................. 6-003469

[51] Int. Cl.⁶ ..................................................... H05K 1/14
[52] U.S. Cl. ..................... 174/261; 174/260; 174/266; 361/767; 361/768; 361/760; 29/832; 29/833; 29/840
[58] Field of Search ..................... 361/778, 777, 361/774, 767, 768, 760, 808; 174/262, 266, 260, 261; 29/832, 833, 834, 840

[56] References Cited

U.S. PATENT DOCUMENTS

| | | | |
|---|---|---|---|
| 5,011,066 | 4/1991 | Thompson | 228/180.2 |
| 5,192,835 | 3/1993 | Bull et al. | 174/260 |
| 5,233,504 | 8/1993 | Mellon et al. | 361/760 |
| 5,266,749 | 11/1993 | Kawakami et al. | 174/262 |
| 5,329,423 | 7/1994 | Scholz | 361/760 |

FOREIGN PATENT DOCUMENTS 2105420  4/1990  Japan .

*Primary Examiner*—Laura Thomas
*Attorney, Agent, or Firm*—Stevens, Davis, Miller & Mosher

[57] ABSTRACT

A method of mounting an electronic part with bumps on a circuit board is disclosed which enables bumps to be bonded to electrodes of the circuit board with certainty and which enables the judgement of the quality of bonding with precision. By making an area of the electrodes of the circuit board larger than those of the electrodes of the electronic part, the bumps heated and molten in the reflow soldering are spread over the electrodes of the circuit board to make its vertical cross-sectional configuration in a trapezoidal form. Therefore, the height dispersion of the bumps and the curvature of the circuit board are effectively absorbed whereby all the bumps can be bonded to the electrodes of the circuit board. Further, by measuring the planar area of the bumps, the judgement of the quality of bonding can be made with precision.

14 Claims, 7 Drawing Sheets

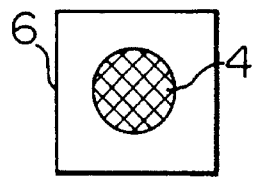 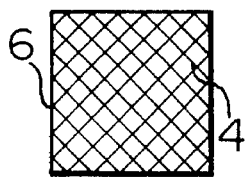 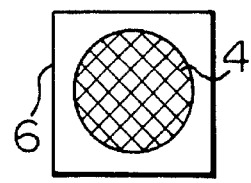
FIG. 7a  FIG. 7b  FIG. 7c
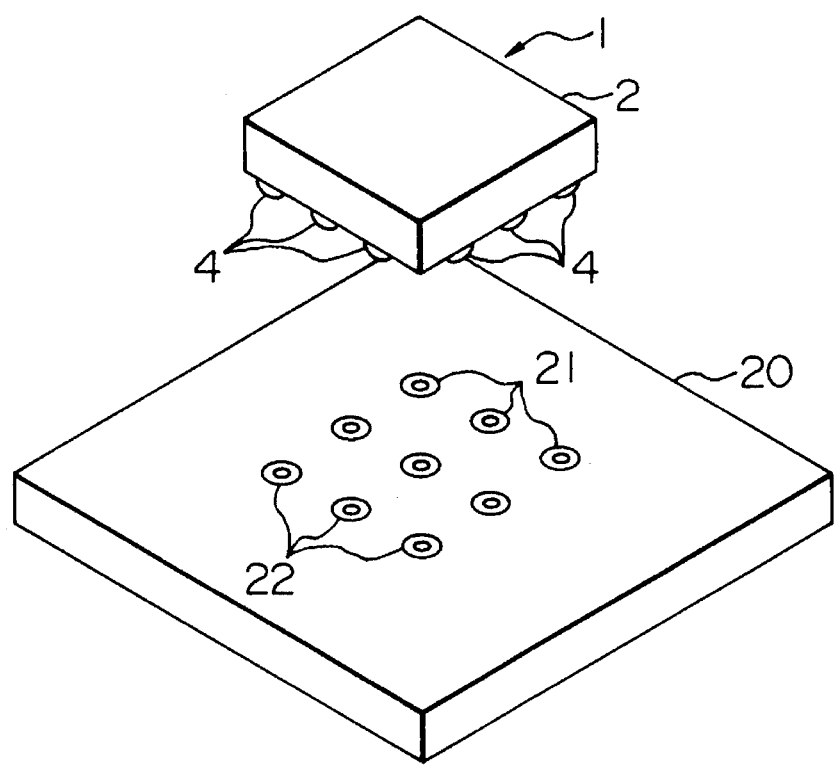
FIG. 8
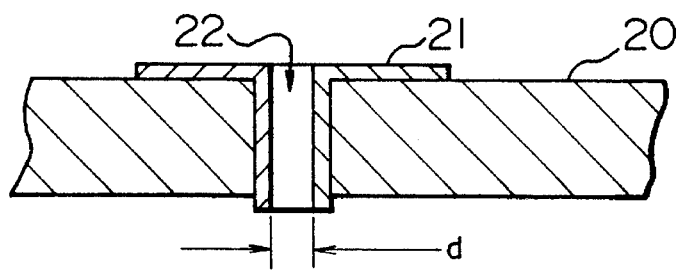
FIG. 9

5,489,750

1

METHOD OF MOUNTING AN ELECTRONIC PART WITH BUMPS ON A CIRCUIT BOARD

This application is a continuation of application Ser. No. 08/205,630, filed Mar. 4, 1994 (abandoned).

BACKGROUND OF THE INVENTION

The present invention relates to a method of mounting an electronic part with bumps projectingly provided from electrodes thereof on electrodes of a circuit board in which the bumps are brought into contact with the electrodes of the circuit board and thereafter a reflow soldering is effected to heat and melt the bumps, thereby the bumps are bonded onto the electrodes of the circuit board.

In recent years, electronic parts with bumps have been spread because electronic parts with bumps occupy a small area in comparison with electronic parts with leads. FIG. 14 is a side view of an electronic part with bumps mounted on the board in the conventional manner. The electronic part with bumps 1 is formed by projectingly providing bumps (projecting electrodes) 4 from electrodes 3 of an electronic part 2 by means of a solder. The bumps 4 are brought into contact with electrodes 6 of a circuit board 5, and thereafter a reflow soldering is effected to heat and melt the bumps 4, thereby bonding the bumps 4 to the electrodes 6.

FIG. 15 is an enlarged view showing a state before the bump 4 is bonded to the electrode 6. The cross-section of the bump 4 is substantially in a spherical shape. FIG. 16 is an enlarged view showing a state after the bonding. The bump 4 assumes a slightly flat cross-sectional shape by being squeezed due to the surface tension at the time of heating and melting and the dead load of the electronic part 2. However, an area of the electrode 6 of the circuit board 5 is substantially identical with that of the electrode 3 of the electronic part 2, so that the diameter of the bump 4 after reflow soldering is almost the same as that of the bump 4 before reflow soldering.

Although the number of bumps 4 projectingly provided from the electronic part 2 is generally more than ten or more than several hundreds and a great many bumps are provided, all of the bumps 4 must be surely brought into contact with and bonded on the electrodes 6 of the circuit board 5. Even when there is only one bump of which bonding is malfunctional, the electronic part is made to be inferior.

However, since it is unavoidable in manufacture that variation in height d1 of the bumps 4 is resulted and it is unavoidable in manufacture that curvature is resulted in the circuit board 5, in the conventional mounting method, there is a problem that it is difficult to surely bring a large number of the bumps 4 all into contact with the electrodes 6 of the circuit board 5. In this connection, the bumps 4 are formed by a screen printing method or an electro-plating method.

Also, after the electronic part 4 with bumps is mounted on the circuit board 5, it is necessary to inspect whether the bumps are firmly bonded upon the electrodes 6 and the circuit board 5. Since, however, in the conventional mounting method, there is little difference in shape between well bonded and badly bonded bumps 4, there is a problem that even when the appearance inspection is effected, for example, by means of a soft X-ray, it is difficult to obtain a quality inspection result with high reliability.

Incidentally, as a difference $\Delta = d1 - d2$ between the height d1 of the bump 4 before the reflow soldering as shown in FIG. 15 and the height d2 of the bump 4 after the reflow soldering as shown in FIG. 16 becomes greater, namely as

2 the height of the bump 4 is more reduced by the reflow soldering, the dispersion of the height of the bump 4 and the curvature of the board 5 can be effectively absorbed and all the bumps can be bonded to the electrodes of the circuit board with certainty. Further, as the difference between the configuration of the bump 4 as shown in FIG. 15 and that of the bump 4 as shown in FIG. 16 becomes greater, it is easier to discriminate the bonding quality by the appearance inspection.

Accordingly, the present invention has been made in view of the foregoing points and has its object to provide a method of mounting an electronic part with bumps on a circuit board, in which all the bumps are surely bonded to the electrodes of the circuit board and which can accurately determine the bonding quality in the appearance inspection.

SUMMARY OF THE INVENTION

A method of mounting an electronic part with bumps comprises forming an area of an electrode of a printed circuit board larger than that of an electrode of the electronic part, spreading the bump which has been heated and melted by means of reflow soldering on the electrode of the board and forming the shape of the bump into a trapezoidal shape in a vertical cross-section of the bump.

BRIEF DESCRIPTION OF THE DRAWINGS

FIG. 7a is an image of a bump before reflow soldering in a second embodiment of the invention;

FIG. 7b is an image of a bump after reflow soldering in the second embodiment of the invention;

FIG. 7c is an image of a bump after reflow soldering in the second embodiment of the invention;

FIG. 8 is a perspective view of an electronic part with bumps and a printed circuit board with of a third embodiment of the invention;

FIG. 9 is an enlarged sectional view of an electrode of the printed circuit board of the third embodiment of the invention;

DESCRIPTION OF THE PREFERRED EMBODIMENTS

With reference to the drawings, a first embodiment of the invention will be described.

Figure 1:
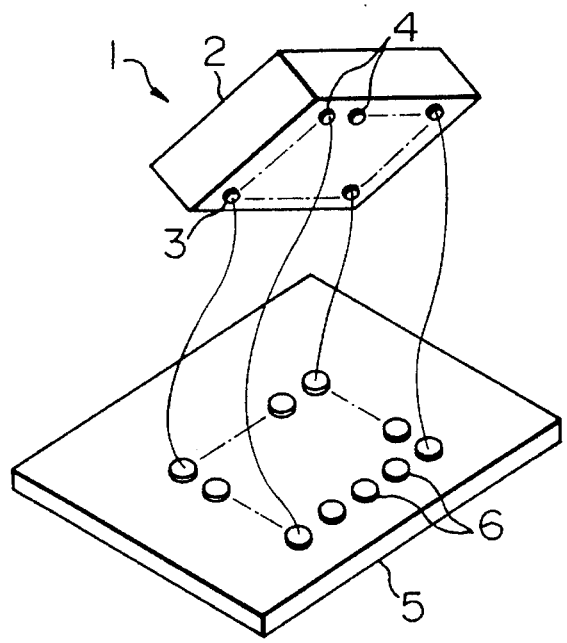
FIG. 1 is a perspective view of an electronic part with bumps and a first embodiment of a circuit board according to the present invention.

FIG. 1 is a perspective view of an electronic part with bumps and a circuit board before mounting. The electronic part with bumps 1 is formed to projectingly form bumps 4 by means of a solder from electrodes 3 which is formed at a lower surface of the electronic part 2. The electronic part with bumps 1 is identical to a conventional electronic part with bumps and it may comprise a multi-chip packaging type one in which a plurality of chips are packaged. On an upper surface of the circuit board 5, there are formed electrodes 6 by an etching method or the like. An area of each of the electrodes 6 of the circuit board 5 is considerably larger than that of each of the electrodes 3 of the electronic part 2. A planar configuration of the electrodes 3 and 6 is shown to be a circular, but they may be a square.

Figure 2:
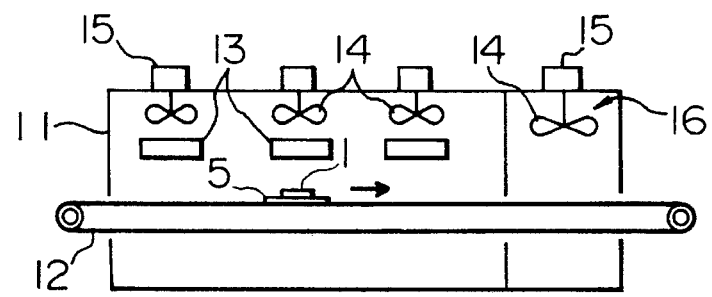
FIG. 2 is a cross sectional view of a reflow soldering apparatus.

The bumped electronic part 1 is mounted on the board 5 in the following steps. The electrodes 6 of the circuit board 5 are painted with a flux, and the bumps 4 are landed on the electrodes 6 so as to be mounted on the circuit board 5 and then reflow soldering is effected. FIG. 2 is a sectional view illustrating the internal structure of the reflow soldering apparatus. A conveyer 12 for transporting the circuit board 5 is provided in a heating chamber 11 and above the conveyer 12, there are arranged heaters 13 and fans 14. Numeral 15 designates driving motor for the fans 14. A cooling chamber 16 in which the cooling fans 14 are arranged is provided at an exit of the heating chamber 11.

While the circuit board 5 is being transported by the conveyer 12 towards the right-hand side, the reflow soldering is effected in which the bumps 4 are heated and molten by the air heated by the heater 13 and blown by the fans 14. Thereafter, by blowing a cooling air onto the circuit board 15 by means of the fans 14, the bumps 4 heated and molten are cooled and solidified. In this connection, can be used a nitrogen reflow soldering apparatus in which a nitrogen gas is supplied into the heating chamber 11.

Figure 3:
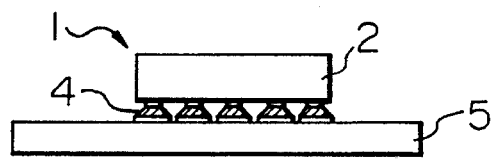
FIG. 3 is a side view of the electronic part with bumps and the circuit board after reflow soldering.
Figure 4:
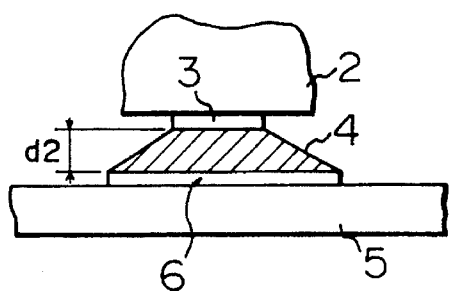
FIG. 4 is a partially enlarged view of the electronic part with bumps and the circuit board after reflow soldering.

As shown in FIGS. 3 and 4, the area of the electrode 6 of the circuit board 5 is larger than the area of the electrode 3 of the electronic part 2. Therefore, the bump 4 heated and molten at the time of reflowing, flows to spread over the entire area or substantially over the entire area of the electrode 6 to assume a trapezoidal form in vertical cross section. The height of the bump d2 becomes markedly lower than the height d1 before reflowing and, their difference Δd=d1−d2 is considerably larger than that of the conventional case. As a result, a spacing between the electronic part 2 and the circuit board 5 becomes narrow and the dispersion of the heights of bumps 4 and the curvature of the circuit board 5 are sufficiently absorbed. Accordingly, there becomes no portion in which the bumps 4 and the electrodes are not in contact with one another and all the bumps 4 are firmly bonded on the electrodes 6 of the circuit board 5.

Figure 5:
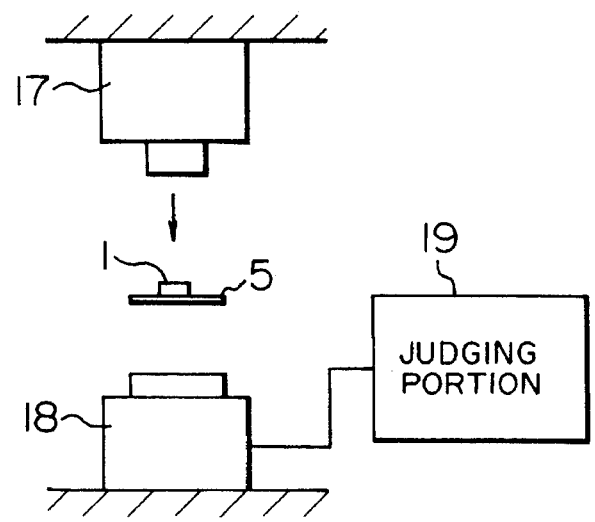
FIG. 5 is a side view of a soft X-ray inspection apparatus.
Figure 6A:
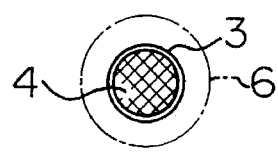
FIG. 6a an image of a bump before reflow soldering taken by the soft X-ray inspection apparatus shown in FIG. 5.
Figure 6B:
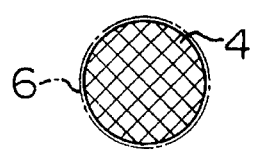
FIG. 6b is an image of a bump after the reflow soldering taken by the apparatus shown in FIG. 5.

FIG. 5 is a side view illustrating the state in which the circuit board 5 on which the bumped electronic part 1 is mounted is observed by a soft X-ray inspection apparatus. Numeral 17 designates a soft X-ray radiating portion, numeral 18 indicates an image-receiving portion and numeral 19 denotes a judging portion for judging the quality of bonding by perceiving the projected area and configuration of the bumps 4 from a X-ray image received at the image-receiving portion 18. FIGS. 6a and 6b respectively illustrate images of a bump 4 received by the soft X-ray inspection apparatus before and after reflow soldering. Since the soft X-ray passes through the electronic part 2 and the circuit board 5 but does not pass through the solder, the image of the bump 4 can successfully be obtained. As shown in FIG. 6b, after the reflow soldering, the bumps 4 are spread over the entire area of the electrodes 6 of the circuit board 5, so that the projected area in the vertical direction becomes markedly larger than that before reflow soldering. In this connection, the bump 4 that was unable to land on the electrode 6 on the circuit board 5 is unable to spread over the electrode 6 of the circuit board 5, so that even after reflow soldering, the projected area remains to have a small area as shown in FIG. 6a. Therefore, after reflow soldering, by observing the projection area of the bump 4 in its vertical direction by means of the soft X-ray and measuring the projection area, it is possible to suitably judge the quality of bonding. More specifically, if the projected area of the bump 4 substantially coincides with the area of the electrode 6 of the circuit board, it is determined that the bonding is good. If it is smaller than the area of the electrode 6 of the circuit board 5, it is determined that the bonding is bad.

FIGS. 7a, 7b and 7c illustrate images of the bump by the soft X-ray when the planar configuration of the electrode 6 is made square (a second embodiment). FIG. 7a shows an image before reflow soldering, and FIG. 7b shows an image after reflow soldering. What is shown by FIG. 7b is a good product whose planar configuration is square, showing that the bump 4 is spread over the entire area of the electrode 6. In comparison, what is shown in FIG. 7c is a bad product since the bump is not sufficiently spread, so that its planar configuration remains to be circular. Therefore, if the planar configuration of the electrode 3 and that of the electrode 6 are made to be different from each other, it is possible to easily judge the quality of soldering on the basis of the planar configuration of the bump after reflow soldering. The configuration of the electrode 6 may be a hexagon or the like other than square.

As described hereinbefore, in the present invention, the heated and molten bump at the reflow soldering spreads over the electrode having a larger area of the circuit board and its vertical cross section becomes a trapezoidal form, so that the difference between the bump height before reflow soldering and that after reflow soldering becomes large to enable the dispersion of the bump heights and the curvature of the circuit board to be absorbed and all the bumps to be bonded to the electrodes of the circuit board with certainty. Furthermore, since the planar area of each bump after reflow soldering becomes markedly enlarged compared with that before reflow soldering, it is possible to suitably judge the quality of bonding, by measuring the planar surface area of the bump by using a soft X-ray, for example.

With reference to FIGS. 8 to 13, a third embodiment of the bumped electronic part mounting method according to the present invention will be described. FIG. 8 is a perspective view illustrating a bumped electronic part and a circuit board according to the present invention and FIG. 9 is a cross-sectional view illustrating an electrode of the circuit board of the third embodiment.

In FIG. 8, numeral 20 designates a circuit board on which there are formed a plurality of electrodes 21 arranged so as to correspond in the positions to bumps 4 of a bumped electronic part 1. Each of these electrodes 21 has a hole 22, at a center thereof, formed to penetrate the circuit board 20 as shown in FIG. 9. Inside of the through hole 22, there is coated a metal (in this embodiment, copper) which has an electrical conductivity and constituting an electrode 21. The inner diameter of the through hole is preferably not less than 0.3 mm.

Figure 10:
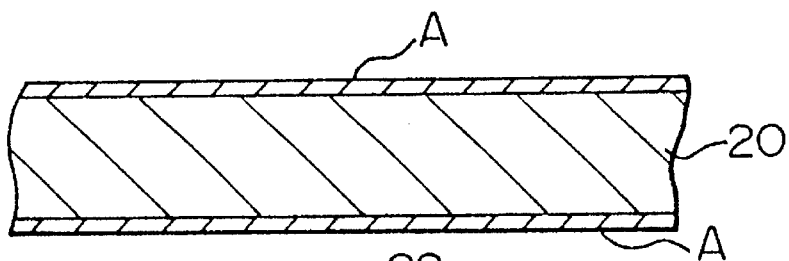
FIG. 10 is a schematic diagram illustrating the steps of manufacturing the printed circuit board of the third embodiment of the invention.
Figure 10:
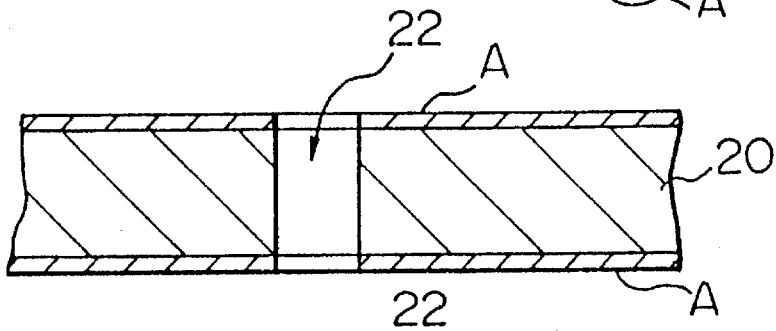
Figure 10:
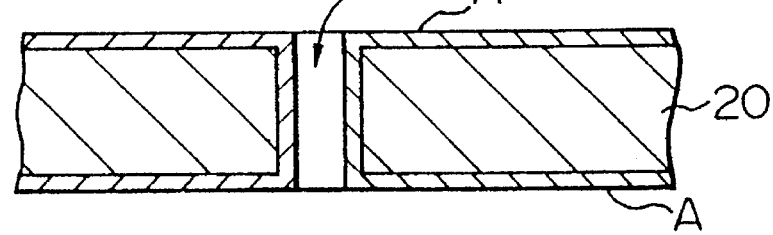
Figure 10:
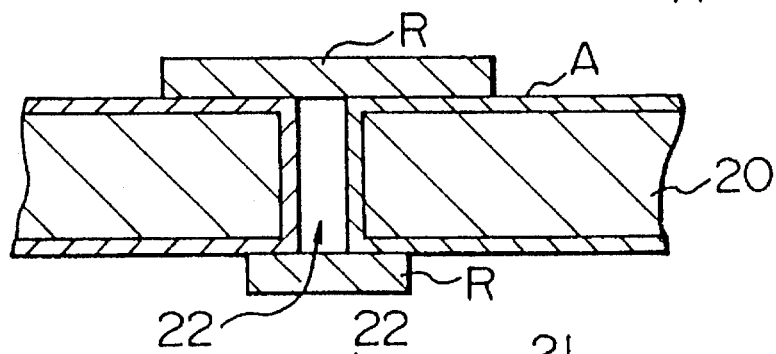
Figure 10:
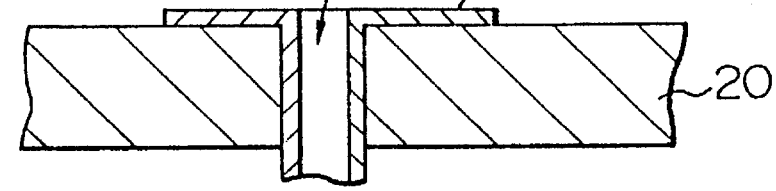

Next, referring to FIG. 10, the steps of manufacturing the circuit board of the third embodiment will be described. First, as shown in FIG. 10(a), each surface of the circuit board 20 is coated by a copper film A in the order of approximately 18 μm.

Next, as shown in FIG. 10(b), a through hole 22 is formed by using, for example, a drill. Thereafter, an electroless plating method is used to form a coating layer of copper on the inner wall of the through hole 22. Then, an electroless plating step is further used to increase the thickness of the copper film A upon each circuit board surface to approximately 30 μm (see FIG. 10(c)).

Subsequently, as shown in FIG. 10(d), there is formed upon each of the upper and lower surfaces of the circuit board 20 a resist R in an area to protect the copper film A which must be left to form an electrode 21 or a circuit pattern. Then, an etching method is used to remove the copper film A other than the area of the resist R. This is followed by removal of the resist R to obtain an electrode 21 of a configuration as shown in FIG. 9.

Figure 11A:
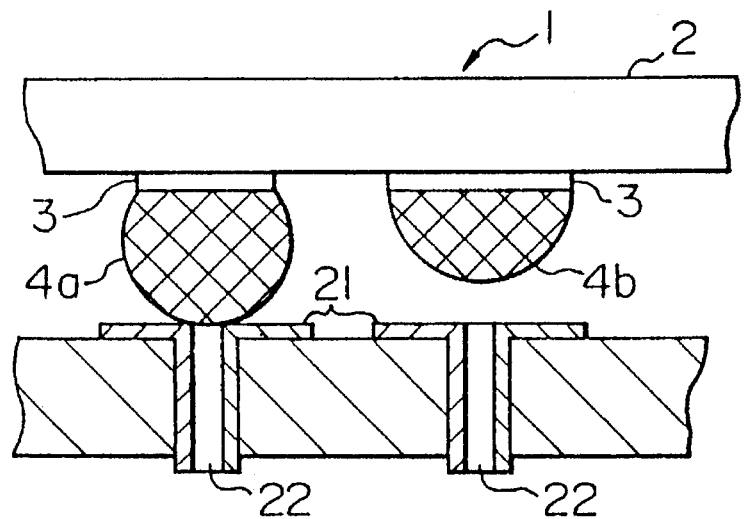
FIG. 11 is a schematic diagram illustrating the steps of soldering between the bumps and the printed circuit of the third embodiment of the invention.
Figure 11B:
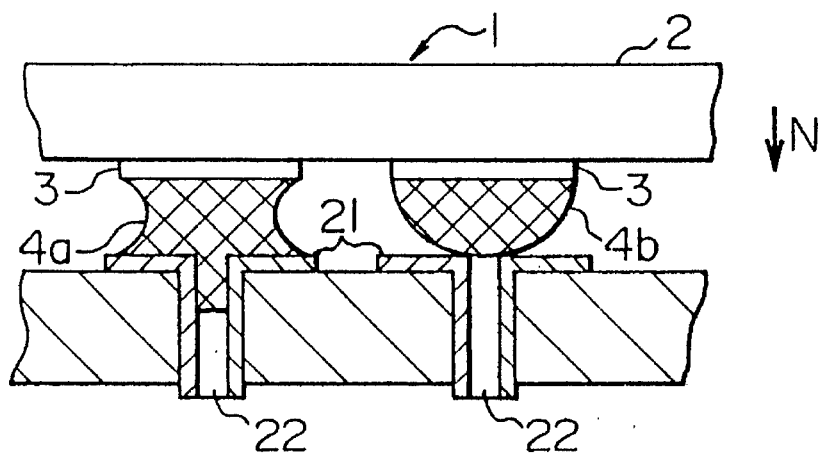

Next, with reference to FIG. 11, the process by which an electronic part 1 with bumps 4a and 4b varying in size is connected to the circuit board 20 will be described.

First, in a state in which the electronic part 1 is mounted upon the circuit board 20, a larger bump 4a is landed on the electrode while a smaller bump 4b is floating.

Subsequently, when the bump 4a and 4b are heated and molten, the larger bump 4a comes into close contact with the electrode 21 and a part thereof flows into the through hole 22.

Figure 11C:
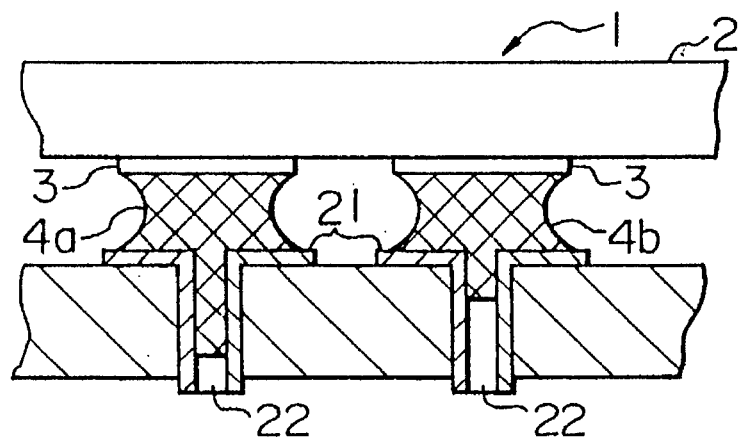

Since this flow-in reduces the amount of the solder existing above the electrode 21, the electronic part 1 is necessarily lowered slightly downwards as shown by the arrow N. In a meanwhile, the smaller bump 4b comes into contact with the electrode 21 and a portion thereof flows into the through hole 22. And, when the melting is completed, as shown in FIG. 11(c), the larger bump 4a flows into the through hole 22 in a greater amount while the smaller bump 4b flows into the through hole 22 in a smaller amount. By means of these larger and smaller flow-in amounts, the dispersion in size of the bumps 4a and 4b is absorbed and the bumps 4a and 4b become both firmly joined to the electrodes 21; hence the joining rate becomes better.

Figure 12:
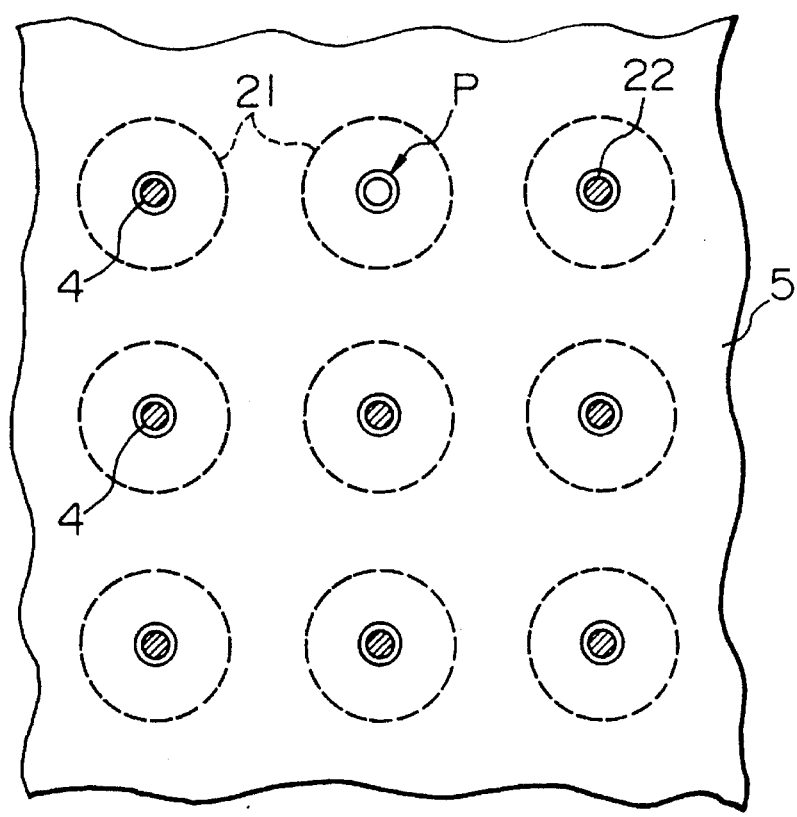
FIG. 12 is a bottom view of the printed circuit board of the third embodiment of the invention after soldered.
Figure 13:
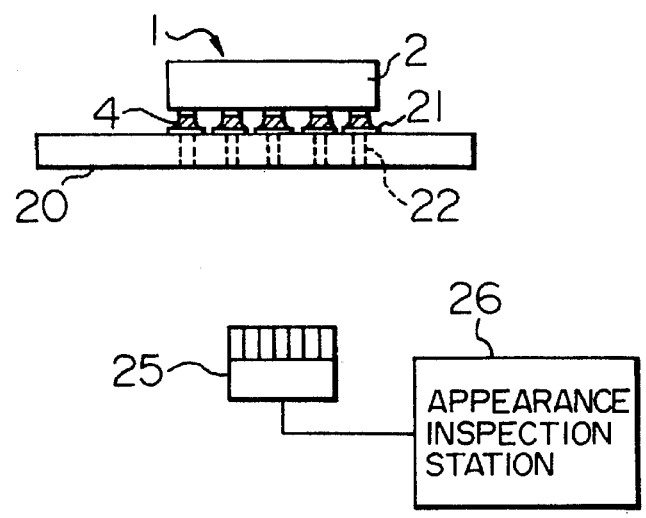
FIG. 13 is a side view of an appearance inspection apparatus in the third embodiment of the invention.
Figure 14:
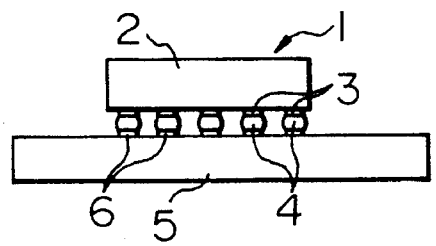
FIG. 14 is a side view of an electronic part with bumps and a conventional circuit board after soldered.
Figure 15:
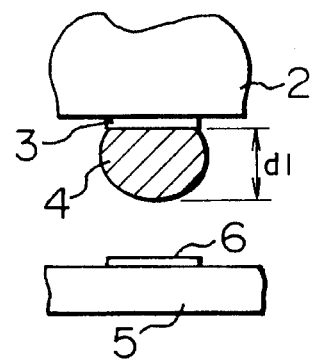
FIG. 15 is an enlarged view of an electronic part with bumps and the conventional circuit board before soldered.
Figure 16:
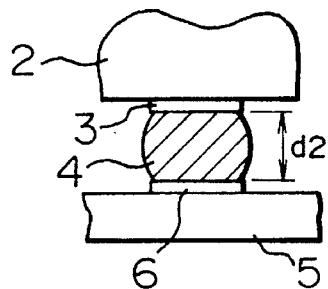
FIG. 16 is an enlarged view of an electronic part with bumps and the conventional circuit board after soldered.

FIG. 12 is a bottom view illustrating the circuit board after the joining whereas FIG. 13 is a side view illustrating an appearance inspection apparatus in the third embodiment according to the present invention. As shown by the oblique lines in FIG. 12, when the portions of the bumps 4a and 4b flow into the through holes 22, by observing this from the rear surface of the board 20, it is confirmed that the joining is successfully effected. Also, as shown at P, if the solder is not seen in the through hole 22, it is determined that the joining is bad at that site. Such an inspection is easily done, without using soft X-rays and instead by naked eyes or using a camera 25 coupled with an appearance inspection apparatus equipped with an appearance inspection station 26 as shown in FIG. 13. In this connection, by applying on inner walls of the through hole 22 a gold plating liable to produce a so-called solder-eating (a phenomenon in which a metal changes its color when a solder is dissolved therein), the judgement of the quality of bonding is more clearly and conveniently accomplished by the appearance inspection.

Since the circuit board according to the third embodiment of the present invention comprises an electrode through which a through hole 22 is formed, the dispersion in the size of bumps can be absorbed easily to enhance the rate of joining. Furthermore, by inspecting an appearance from the rear surface of the circuit board, an inspection of quality of bonding can be easily performed.

What is claimed is:

1. A method of mounting an electronic part with at least one bump on a circuit board, said method comprising:
   providing the electronic part with at least one electrode having a first area;
   providing the circuit board with at least one electrode having a second area larger than the first area and being formed of a single electrode lying along a single plane;
   providing the at least one bump projectingly from the at least one electrode of the electronic part;
   landing the at least one bump upon the at least one electrode of the circuit board;
   effecting a reflow soldering to heat and melt the at least one bump, thereby bonding the at least one bump onto the at least one electrode of the circuit board; and
   spreading over the at least one bump heated and molten in the reflow soldering over the at least one electrode of said circuit board to produce a spread bump.

2. A method of mounting an electronic part with at least one bump on a circuit board as claimed in claim 1, further comprising forming the spread bump in cross section into a substantially trapezoidal shape.

3. A method of mounting an electronic part with at least one bump on a circuit board as claimed in claim 1, wherein the electronic part has a plurality of electrodes having the first area and having a plurality of bumps, and wherein the circuit board has a plurality of electrodes having the second area.

4. A method of mounting an electronic part with at least one bump on a circuit board as claimed in claim 3, wherein each of the plurality of bumps connects a single one of the plurality of electrodes of the electronic part to a single one of the plurality of electrodes of the circuit board.

5. A method of mounting an electronic part with at least one bump on a circuit board as claimed in claim 2, wherein said substantially trapezoidal shape has a longer base in contact with said at least one electrode on said circuit board and a shorter base in contact with said at least one electrode on said electronic part.

6. A method of mounting an electronic part with bumps on a circuit board, said method comprising:
   providing the electronic part with electrodes, each having a first area;
   providing the circuit board with electrodes, each having a second area larger than the first area;
   providing the bumps projectingly from the electrodes of the electronic part;
   landing the bumps upon the electrodes of the circuit board;
   effecting a reflow soldering to heat and melt the bumps, thereby bonding the bumps onto the electrodes of the circuit board;
   spreading over the bumps heated and molten in the reflow soldering over the electrodes of said circuit board to produce spread bumps;

using an X-ray to obtain a projected image of said bumps after said reflow soldering; and judging a state of joining of said bumps with the electrodes of said circuit board from said projected image.

7. A method of mounting an electronic part with bumps on a circuit board as claimed in claim 6, wherein the quality of bonding is judged as good when a projected area of the bumps that appears on said projected image is larger than a projected area of the bumps before said reflow soldering and the quality of bonding is judged as bad when the projected area that appears on said projected image is substantially the same as the projected area of the bumps before said reflow soldering.

8. A method of mounting an electronic part with bumps on a circuit board as claimed in claim 6, wherein the quality of bonding is judged as good when a projected area of said bumps that appears on said projected image is substantially the same as an area of said electrodes of said circuit board and otherwise the quality of bonding is judged as bad.

9. A method of mounting an electronic part with bumps on a circuit board as claimed in claim 6, wherein the quality of bonding is judged as good when a planar configuration of the bumps that appears on said projected image substantially coincides with a configuration of said electrodes of said circuit board and otherwise the quality of bonding is judged as bad.

10. A method of mounting an electronic part with bumps on a circuit board by landing the bumps formed by a solder on electrodes of the electronic part upon electrodes formed on an upper surface of the circuit board and thereafter effecting a reflow soldering to heat and melt the bumps, thereby bonding the bumps onto the electrodes of the circuit board, characterized by forming through holes which pass from central portions of the electrodes of the circuit board to a rear surface of the circuit board, and having the solder molten in said reflow soldering into said through holes.

11. A method of mounting an electronic part with bumps on a circuit board as claimed in claim 10, wherein a state of joining of the bumps with the circuit board is inspected by observing, after said reflow soldering, a state of the solder in said through holes from the rear surface of said circuit board.

12. A method of mounting an electronic part with bumps on a circuit board as claimed in claim 11, wherein the quality of bonding is judged as good when the solder is seen in said through holes and the quality of bonding is judged as bad when the solder is not seen in said through holes.

13. A printed circuit board for an electronic part with solder bumps provided on electrodes thereof, said board comprising a plurality of electrodes formed on a surface thereof, said electrodes having larger planar areas than those of said electrodes of the electronic part, each of said plurality of electrodes of said printed circuit board being formed of a single electrode lying along a single plane.

14. A printed circuit board as claimed in claim 13, wherein each of the electrodes of said printed circuit board has, at a center thereof, a through hole passing through said board.

* * * * *